United States Patent
Otake

(10) Patent No.: US 8,039,872 B2
(45) Date of Patent: Oct. 18, 2011

(54) NITRIDE SEMICONDUCTOR DEVICE INCLUDING A GROUP III NITRIDE SEMICONDUCTOR STRUCTURE

(75) Inventor: Hirotaka Otake, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 287 days.

(21) Appl. No.: 12/219,671

(22) Filed: Jul. 25, 2008

(65) Prior Publication Data
US 2009/0026556 A1    Jan. 29, 2009

(30) Foreign Application Priority Data
Jul. 25, 2007    (JP) .................. 2007-193410

(51) Int. Cl.
*H01L 29/66*    (2006.01)
(52) U.S. Cl. ................ 257/194; 257/E29.001
(58) Field of Classification Search ............ 257/194, 257/E29.001
See application file for complete search history.

(56) References Cited

U.S. PATENT DOCUMENTS
7,491,983 B2 * 2/2009 Otsuka et al. ............. 257/183
2003/0082860 A1  5/2003 Yoshida et al.
2006/0065912 A1 * 3/2006 Beach ...................... 257/194

FOREIGN PATENT DOCUMENTS
JP    2003-163354    6/2003
* cited by examiner

*Primary Examiner* — Lex Malsawma
(74) *Attorney, Agent, or Firm* — Rabin & Berdo, P.C.

(57) ABSTRACT

A nitride semiconductor device according to the present invention includes a Group III nitride semiconductor; and an insulating film containing oxygen formed on the surface of the Group III nitride semiconductor, wherein the nitrogen concentration in a region provided with the insulating film is higher than the nitrogen concentration in a region not provided with the insulating film on the surface of the group III nitride semiconductor.

4 Claims, 11 Drawing Sheets

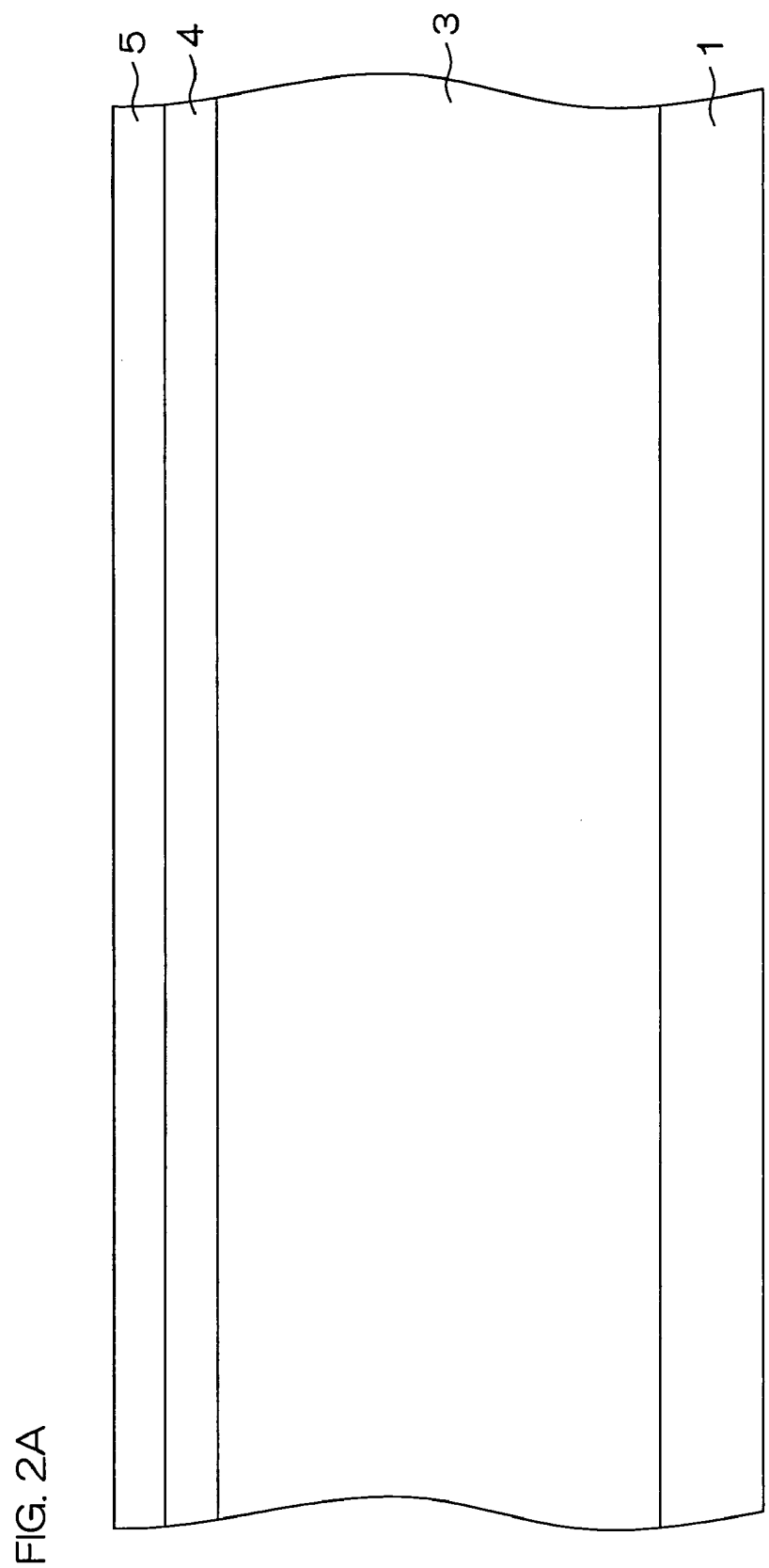

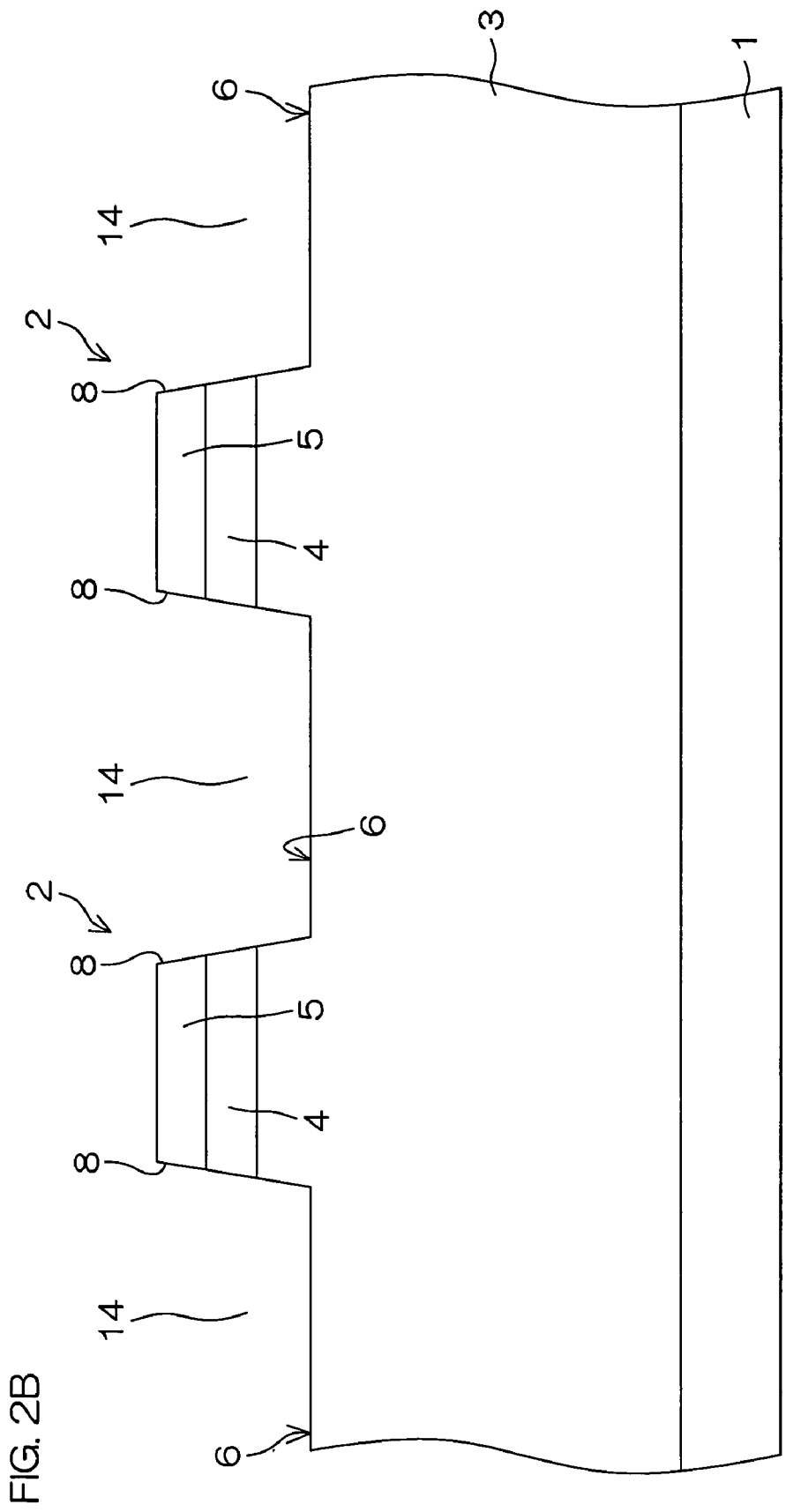

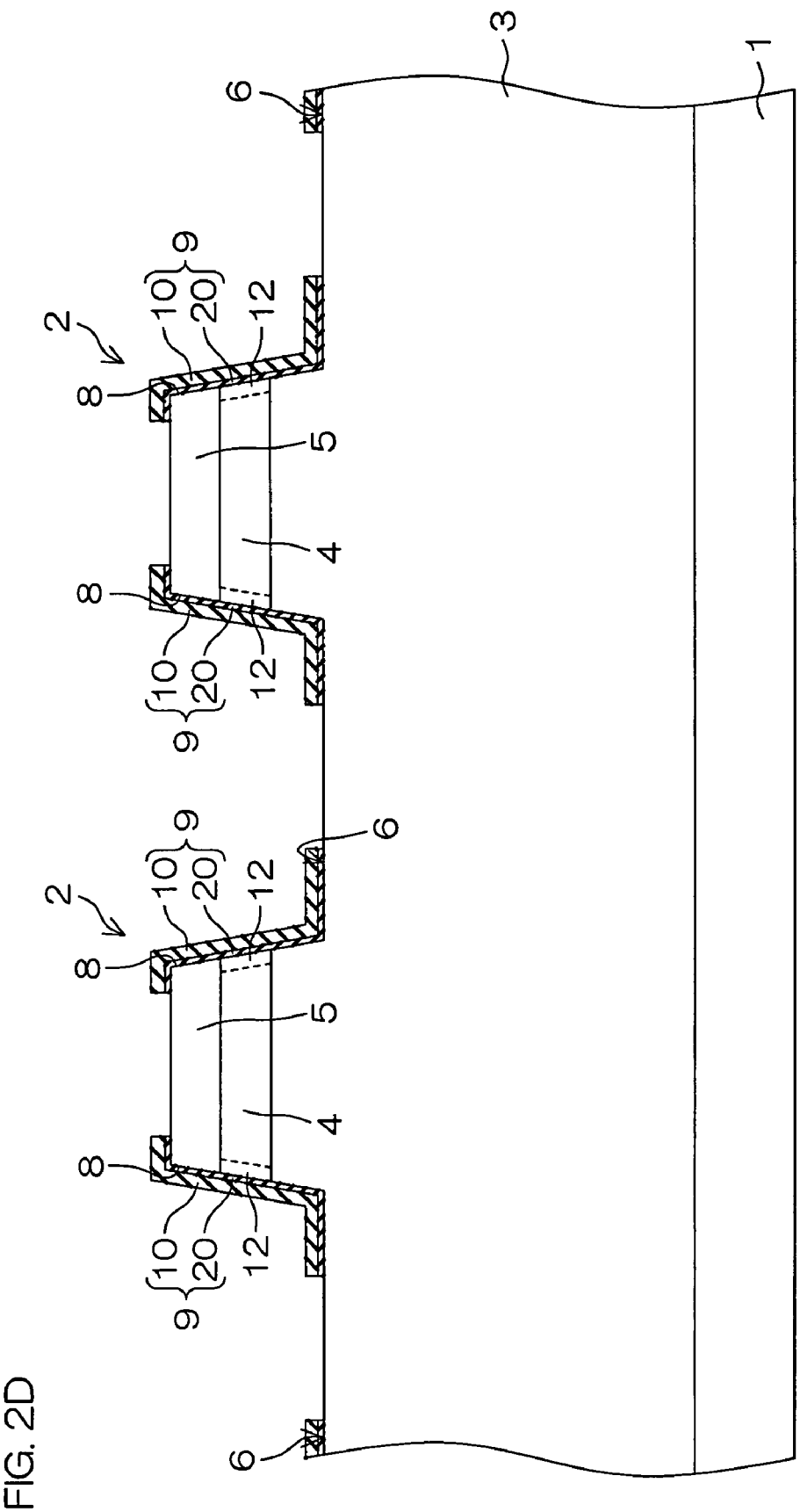

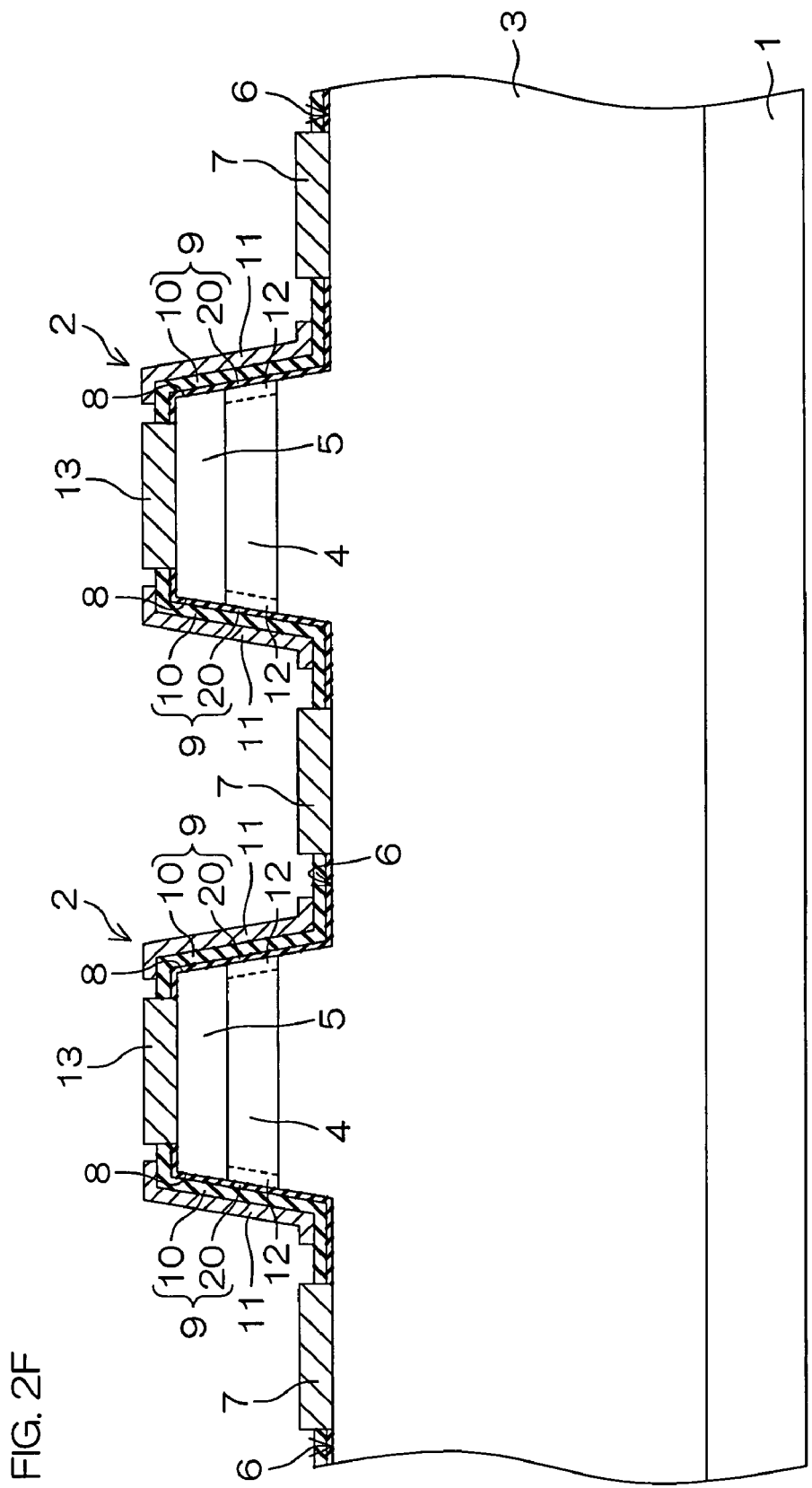

NITRIDE SEMICONDUCTOR DEVICE INCLUDING A GROUP III NITRIDE SEMICONDUCTOR STRUCTURE

BACKGROUND OF THE INVENTION

1. Field of the Invention

The present invention relates to a nitride semiconductor device using a Group III nitride semiconductor and a manufacturing method thereof.

2. Description of Related Art

Conventionally, a power device using a silicon semiconductor is used for a power amplifier circuit, a power supply circuit, a motor drive circuit, or the like. However, from theoretical limitations of the silicon semiconductor, high withstand voltage, low resistance, and high speed of the silicon device have nearly reached their limits, which leads to difficulties in satisfying market needs.

Therefore, consideration has been given to the development of a nitride semiconductor device having characteristics such as high withstand voltage, high-temperature operation, a large current density, high-speed switching, low on-resistance, and the like.

FIG. 5 is a schematic sectional view for illustrating the structure of a conventional field-effect transistor (nitride semiconductor device) using a group III nitride semiconductor.

This field-effect transistor includes a sapphire substrate 81 and an n-p-n laminated structure 93 formed by an undoped GaN layer 82, an n-type GaN layer 83, a p-type GaN layer 84 and an n-type GaN layer 85 successively laminated from the side closer to the sapphire substrate 81. A mesa-like laminated portion 92 is formed in the laminated structure 93 by performing dry etching from the surface of the n-type GaN layer 85 up to an intermediate portion of the n-type GaN layer 83. The mesa-like laminated portion 92 has slopes 91 inclined at a prescribed angle with respect to the lamination interfaces of the laminated structure 93 on both sides thereof. A gate insulating film 86 made of $SiO_2$ (silicon oxide) is formed on the surface (including the slopes 91) of the laminated structure 93. The gate insulating film 86 is provided with contact holes partially exposing the n-type GaN layer 85 and the n-type GaN layer 83 respectively. A source electrode 88 is formed on the n-type GaN layer 85 exposed from the corresponding contact hole. The source electrode 88 is electrically connected to the n-type GaN layer 85. On the other hand, drain electrodes 89 are formed on the n-type GaN layer 83 exposed from the corresponding contact holes. The drain electrodes 89 are electrically connected to the n-type GaN layer 83. Gate electrodes 87 are formed on the gate insulating film 86 in portions opposed to the slopes 91. Interlayer dielectric films 90 made of polyimide are interposed between the adjacent ones of the source electrode 88, the drain electrodes 89 and the gate electrodes 87, to isolate the same from one another.

In the field-effect transistor having the aforementioned structure, the gate insulating film 86 is formed by depositing $SiO_2$ on the surface of the laminated structure 93 by a method utilizing plasma such as CVD (Chemical Vapor Deposition), PVD (Physical Vapor Deposition) or ECR (Electron Cyclotron Resonance) sputtering, for example.

$SiO_2$ employed for the gate insulating film 86 can reduce gate leakage current resulting from a tunnel effect. Therefore, $SiO_2$ is preferably used as the material for a gate insulating film.

Around the surface of the laminated structure 93 made of GaN, however, nitrogen vacancies are formed due to the lack of nitrogen atoms (N atoms) of the GaN crystal lattice in the steps of forming the slopes 91 by the dry etching and forming the gate insulating film 86 with the plasma. Therefore, the surface level (interfacial level) density of the interface is increased on the interface between the surface of the laminated structure 93 and the gate insulating film 86 made of $SiO_2$ containing oxygen as the main element, and a large number of surface charges (interfacial charges) are generated. When the surface level density of the interface between the surface of the laminated structure 93 and the gate insulating film 86 is increased, surface leakage current (off-leakage current) flowing on the surface of the laminated structure 93 is disadvantageously increased.

SUMMARY OF THE INVENTION

An object of the present invention is to provide a nitride semiconductor device using a group III nitride semiconductor and a method for producing the same, capable of reducing surface leakage current.

The same or different aspect of the present invention may provide a method for producing a nitride semiconductor device including the steps of: forming an insulating film containing oxygen on the surface of a group III nitride semiconductor; and placing the group III nitride semiconductor under a nitrogen atmosphere in advance of the step of forming the insulating film.

According to this method, the group III nitride semiconductor is placed under the nitrogen atmosphere before the onset of the formation of the insulating film containing oxygen on the surface thereof. In the step of forming the insulating film, therefore, nitrogen vacancies generated on the surface of the group III nitride semiconductor can be compensated by introducing nitrogen into the same. Thus, the concentration of the nitrogen vacancies can be reduced on the surface of the group III nitride semiconductor. Further, it is also possible to form an insulating film containing nitrogen on the surface of the group III nitride semiconductor by setting proper film forming conditions. Consequently, the surface level density can be reduced by suppressing formation of surface charges on the surface of the group III nitride semiconductor, whereby surface leakage current can be reduced.

The step of forming the insulating film containing oxygen may include a plasma generation step of generating plasma and the steps of applying a voltage to a target and colliding the plasma with the target and placing the group III nitride semiconductor under an oxygen atmosphere at the time of the collision of the plasma. In this case, the step of placing the group III nitride semiconductor under the nitrogen atmosphere is preferably a step of placing the group III nitride semiconductor under the nitrogen atmosphere at the time of the generation of the plasma.

The group III nitride semiconductor is a semiconductor such as AlN (aluminum nitride), GaN (gallium nitride) or InN (indium nitride), for example, obtained by combining a group III element and nitrogen with each other. In general, the group III nitride semiconductor can be expressed as $Al_xIn_yGa_{1-x-y}N$ ($0 \leq x \leq 1$, $0 \leq y \leq 1$, $0 \leq x+y \leq 1$).

The same or different aspect of the present invention may provide a method for producing a nitride semiconductor device, including: a nitride semiconductor structure forming step of forming a nitride semiconductor structure made of a group III nitride semiconductor by successively laminating an n-type first layer, a second layer containing a p-type impurity and an n-type third layer; a wall surface forming step of forming a wall surface extending over the first, second and third layers; a gate insulating film forming step of forming a gate insulating film containing oxygen on a region of the wall surface extending over the first, second and third layers; a step of placing the nitride semiconductor structure under a nitrogen atmosphere in advance of the gate insulating film forming step; and a gate electrode forming step of forming a gate electrode to be opposed to the second layer through the gate insulating film.

According to this method, the n-type first layer, the second layer containing the p-type impurity and the n-type third layer are successively laminated, thereby forming an n-p-n nitride semiconductor structure. The wall surface extending over the first to third layers is formed on the nitride semiconductor structure, and the gate insulating film containing oxygen is formed on the region of this wall surface extending over the first to third layers. On the other hand, the nitride semiconductor structure is placed under the nitrogen atmosphere before the formation of the gate insulating film. The gate electrode is formed to be opposed to the second layer through the gate insulating film. A source electrode may be formed to be electrically connected to the third layer, and a drain electrode may be formed to be electrically connected to the first layer.

The nitride semiconductor structure is placed under the nitrogen atmosphere before the formation of the gate insulating film, whereby nitrogen vacancies generated on the surface (including the wall surface) of the nitride semiconductor structure can be compensated by introducing nitrogen into the same. Therefore, the concentration of the nitrogen vacancies can be reduced on the surface of the nitride semiconductor structure. Further, it is also possible to form an insulating film containing nitrogen on the surface of the nitride semiconductor structure by setting proper film forming conditions. Therefore, when the source electrode and the drain electrode are formed, for example, the surface level density can be reduced by suppressing formation of surface charges on the region of the surface of the nitride semiconductor structure between the source and drain electrodes (between the source and the drain). Consequently, surface leakage current flowing between the source and drain electrodes can be reduced. Needless to say, the nitride semiconductor device made of the group III nitride semiconductor can realize superior characteristics such as high withstand voltage, high-temperature operation, large current density, high-speed switching and low on-resistance as compared with a device made of a silicon semiconductor.

The operation of the nitride semiconductor device is now described. For example, a bias voltage positive on the side of the drain electrode is supplied between the source and the drain. Thus, a reverse voltage is supplied to the p-n junction on the interface between the first and second layers, whereby the third and first layers, i.e., the source and the drain are cut off (reverse-biased). When a bias voltage of not less than a prescribed value (gate threshold voltage) positive with reference to the source electrode is applied to the gate electrode in this state, electrons are induced in the vicinity (channel region) of the interface between the wall surface and the gate insulating film in the second layer, to form an inversion layer (channel). The source and the drain conduct through this inversion layer, thereby implementing the operation of the nitride semiconductor device.

Preferably, the gate insulating film forming step is a step of forming a gate insulating film containing at least one material selected from a group of $SiO_2$, $HfO_2$, $Ga_2O_3$, $Al_2O_3$ and SiON.

Preferably, the aforementioned method for producing a nitride semiconductor device further includes a fourth layer forming step of forming a fourth layer different in conductivity from the second layer on a semiconductor surface portion of the second layer exposed through the wall surface forming step, and the gate insulating film forming step is a step of forming the gate insulating film to be in contact with the fourth layer.

According to this method, the fourth layer different in conductivity from the second layer is formed on the semiconductor surface portion of the second layer exposed through the wall surface forming step. The gate insulating film is arranged to be in contact with the fourth layer, and the gate electrode is opposed to the fourth layer through the gate insulating film.

Thus, the inversion layer (channel) is formed on the fourth layer in the aforementioned operation of the nitride semiconductor device. Therefore, when the fourth layer is made of a p-type semiconductor having a lower acceptor concentration than the second layer, for example, the gate threshold voltage can be suppressed as compared with a case of forming the inversion layer on the second layer. Thus, an excellent nitride semiconductor device can be realized.

The fourth layer may be made of a p-type semiconductor having a lower acceptor concentration than the second layer as described above, or may be made of any material selected from among an n-type semiconductor, an i-type semiconductor and a semiconductor containing n- and p-type impurities, for example. When the fourth layer is made of an n-type semiconductor, the concentration of the n-type impurity and the thickness of the fourth layer can be properly controlled in order to implement normally-off operation of the nitride semiconductor device.

The same or different aspect of the present invention may provide a nitride semiconductor device including: a group III nitride semiconductor; and an insulating film containing oxygen formed on the surface of the group III nitride semiconductor, wherein the nitrogen concentration in a region provided with the insulating film is higher than the nitrogen concentration in a region not provided with the insulating film on the surface of the group III nitride semiconductor.

According to this configuration, the nitrogen concentration in the region provided with the insulating film is higher than the nitrogen concentration in the region not provided with the insulating film on the surface of the group III nitride semiconductor. Therefore, the nitrogen vacancy concentration in the region provided with the insulating film can be reduced on the surface of the group III nitride semiconductor. Consequently, the surface level density can be reduced by suppressing generation of surface charges on the surface of the group III nitride semiconductor. Therefore, surface leakage current can be reduced.

The same or different aspect of the present invention may provide a nitride semiconductor device including: a nitride semiconductor structure made of a group III nitride semiconductor including an n-type first layer, a second layer containing a p-type impurity laminated on the first layer and an n-type third layer laminated on the second layer, and the nitride semiconductor structure having a wall surface extending over the first, second and third layers; a gate insulating film containing oxygen formed on a region of the wall surface extending over the first, second and third layers; a gate electrode opposed to the second layer through the gate insulating film; a source electrode electrically connected to the third layer; and a drain electrode electrically connected to the first layer, wherein the nitrogen concentration in a region provided with the gate insulating film is higher than the nitrogen concentration in a region not provided with the gate insulating film on the surface of the nitride semiconductor structure.

According to this configuration, the nitrogen concentration in the region provided with the gate insulating film is higher than the nitrogen concentration in the region not provided with the gate insulating film on the surface of the nitride semiconductor structure. Therefore, the nitrogen vacancy concentration can be reduced in the region located between the source and drain electrodes on the surface of the nitride semiconductor structure. Thus, the surface level density can be reduced by suppressing generation of surface charges on the region (located between the source and drain electrodes) provided with the gate insulating film. Consequently, surface leakage current flowing between the source and drain electrodes can be reduced.

The same or different aspect of the present invention may provide a nitride semiconductor device including: a nitride semiconductor layer made of a group III nitride semiconductor containing a p-type impurity; a first n-type region and a second n-type region positioned on the surface layer of the nitride semiconductor layer at a prescribed interval; a gate insulating film containing oxygen formed on a region of the surface of the nitride semiconductor layer extending over the first n-type region and the second n-type region; a gate electrode opposed to the nitride semiconductor layer on a region between the first n-type region and the second n-type region through the gate insulating film; a drain electrode electrically connected to the first n-type region; and a source electrode electrically connected to the second n-type region, wherein the nitrogen concentration in a region provided with the gate insulating film is higher than the nitrogen concentration in a region not provided with the gate insulating film on the surface of the nitride semiconductor layer.

According to this configuration, the first n-type region and the second n-type region are positioned on the surface layer of the nitride semiconductor layer made of the group III nitride semiconductor containing the p-type impurity at the prescribed interval. Thus, an n-p-n junction is formed on the nitride semiconductor layer along the surface thereof. On the surface of the nitride semiconductor layer, the gate insulating film containing oxygen is arranged on the region extending over the first n-type region and the second n-type region. A portion opposed to the gate insulating film forms a channel region on the region (p-type region) between the first and second n-type regions through the gate insulating film, and the gate electrode is opposed to this channel region. The drain electrode is provided to be electrically connected to the first n-type region, and the source electrode is provided to be electrically connected to the second n-type region. The nitrogen concentration in the region provided with the gate insulating film is higher than the nitrogen concentration in the region not provided with the gate insulating film on the surface of the nitride semiconductor layer.

Therefore, the nitrogen vacancy concentration can be reduced in the region located between the source and drain electrodes on the surface of the nitride semiconductor layer. Thus, the surface level density can be reduced by suppressing generation of surface charges on the region (between the source and drain electrodes) provided with the gate insulating film. Consequently, surface leakage current flowing between the source and drain electrodes can be reduced.

Preferably, the gate insulating film includes a silicon nitride film formed on the surface of the group III nitride semiconductor and an oxide film containing oxygen formed on the silicon nitride film.

According to this configuration, the silicon nitride film is interposed between the group III nitride semiconductor and the oxide film. When the silicon nitride film is interposed between the group III nitride semiconductor and the oxide film, generation of surface charges can be further suppressed on the surface of the group III nitride semiconductor, whereby the surface leakage current can be further reduced. The silicon nitride film preferably has a sufficiently small thickness of about 1 nm, more specifically, 0.5 nm to 3 nm. When the thickness of the silicon nitride film is in this range, charges collected on the interface (insulating film interface) between the silicon nitride film and the oxide film can easily pass through the silicon nitride film. Consequently, the insulating film interface can be prevented from being kept in a charged state.

These and other objects, feature and effects of the present invention will be more apparent from the following embodiments described with reference to the accompanying drawings.

BRIEF DESCRIPTION OF THE SEVERAL VIEWS OF THE DRAWING

FIGS. 2A to 2F are illustrative sectional views successively showing the steps of producing the field-effect transistor shown in FIG. 1.

DETAILED DESCRIPTION OF THE INVENTION

Figure 1:
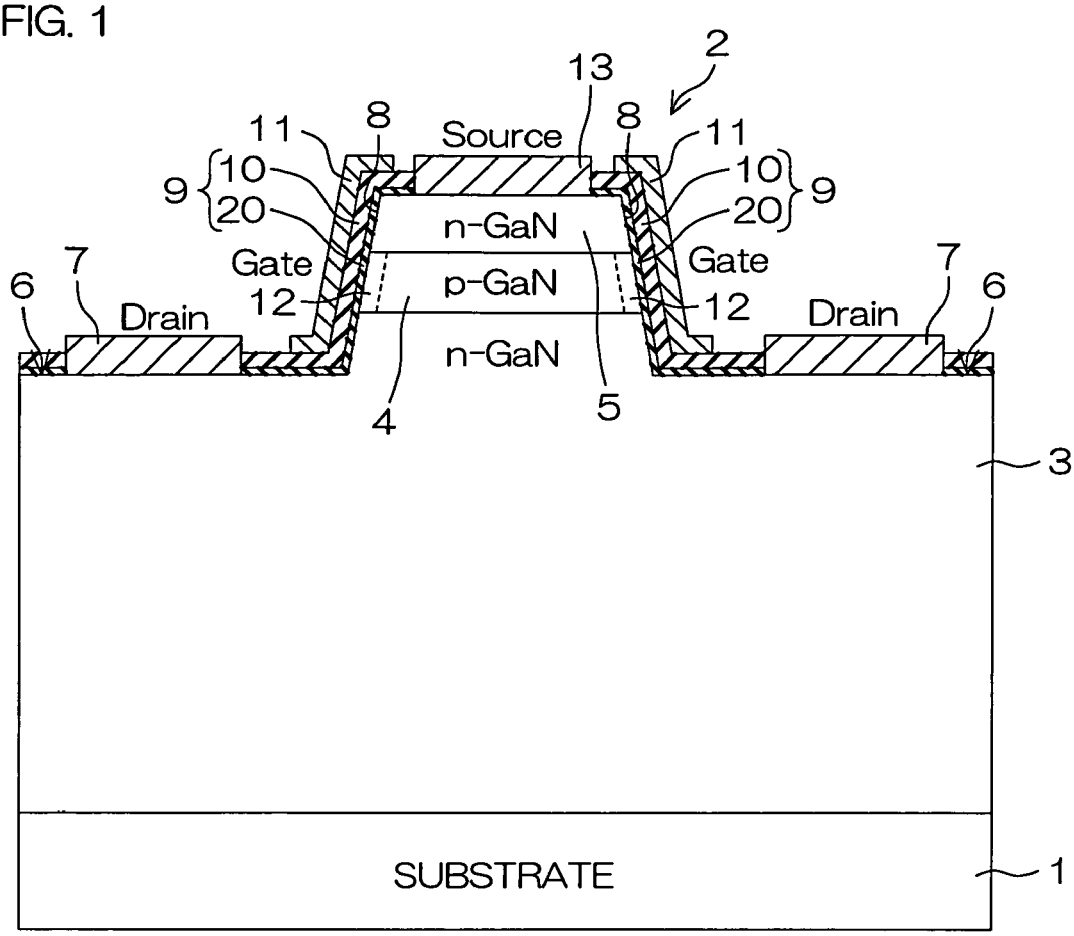
FIG. 1 is a schematic sectional view for illustrating the structure of a field-effect transistor according to a first embodiment of the present invention.

FIG. 1 is a schematic sectional view for illustrating the structure of a field-effect transistor according to a first embodiment of the present invention.

This field-effect transistor (nitride semiconductor device) includes a substrate 1 and a nitride semiconductor laminated structure 2 made of a GaN compound semiconductor (group III nitride semiconductor) grown on the substrate 1.

For example, an insulating substrate such as a sapphire substrate or a conductive substrate such as a GaN substrate, a ZnO substrate, an Si substrate, a GaAs substrate or an SiC substrate can be applied to the substrate 1.

The nitride semiconductor laminated structure 2 includes an n-type GaN layer 3 (first layer), a p-type GaN layer 4 (second layer) and an n-type GaN layer 5 (third layer), which are laminated in this order. The nitride semiconductor laminated structure 2 is etched across the lamination interfaces from the n-type GaN layer 5 up to a depth exposing the n-type GaN layer 3, to have a trapezoidal section (mesa shape). The n-type GaN layer 3 has drawn portions 6 drawn from both sides of the nitride semiconductor laminated structure 2 in the lateral direction (this direction is hereinafter referred to as "width direction" in this embodiment) along the lamination interfaces of the nitride semiconductor laminated structure 2.

In the vicinity of an intermediate portion of the nitride semiconductor laminated structure 2 in the width direction, on the other hand, wall surfaces 8 extending over the n-type GaN layer 3, the p-type GaN layer 4 and the n-type GaN layer 5 are formed following the formation of the drawn portions 6.

Regions 12 (fourth layer) are formed on semiconductor surface portions of the p-type GaN layer 4 at the wall surfaces 8. These regions 12 are made of a semiconductor different in conductivity from the p-type GaN layer 4, such as a p⁻-type semiconductor having a lower acceptor concentration than the p-type GaN layer 4, for example. The thickness of the regions 12 in the direction orthogonal to the wall surfaces 8 is several nm to 100 nm, for example. The material for the regions 12 is not restricted to the p⁻-type semiconductor, but may be an n-type semiconductor containing an n-type impurity, an i-type semiconductor hardly containing impurities or a semiconductor containing n- and p-type impurities, for example. When a proper bias voltage is supplied to a gate electrode 11 (described later), inversion layers allowing the n-type GaN layers 3 and 5 to conduct are formed on the regions 12 in the vicinity of interfaces between the same and a silicon nitride film 20 (described later).

The nitride semiconductor laminated structure 2 is formed on the substrate 1 by the so-called MOCVD (Metal Oxide Chemical Vapor Deposition), for example. When the principal surface of the substrate 1 is a c-plane (0001), for example, the principal surfaces of the n-type GaN layer 3, the p-type GaN layer 4 and the n-type GaN layer 5 forming the nitride semiconductor laminated structure 2 epitaxially grown on the substrate 1 are also c-planes (0001). Therefore, the lamination interfaces of the nitride semiconductor laminated structure 2 and the top surface of the n-type GaN layer 5 are c-planes (0001). Thus, the wall surfaces 8 formed by etching the nitride semiconductor laminated structure 2 across the lamination interfaces thereof are planes (other than the c-planes) inclined with respect to the c-planes (0001) in the range of 15° to 90°, for example. More specifically, the wall surfaces 8 are nonpolar planes such as m-planes (10-10) or a-planes (11-20), or semipolar planes such as (10-13), (10-11), (11-22), or the like.

The surface of the nitride semiconductor laminated structure 2 is compensated with nitrogen. In general, nitrogen vacancies are formed in the vicinity of the surface of the nitride semiconductor laminated structure 2 made of GaN, due to the lack of nitrogen atoms (N atoms) of the GaN crystal lattice. When the surface of the nitrogen semiconductor laminated structure 2 is compensated with nitrogen as in this embodiment, however, nitrogen vacancies are hardly present in the vicinity of the surface of the nitride semiconductor laminated structure 2. A GaN surface compensated with nitrogen has a higher nitrogen concentration than a GaN surface not compensated with nitrogen, and is hardly surface-charged. For example, the surface charge concentration of the GaN surface not compensated with nitrogen is $1 \times 10^{12}$ $cm^{-2} \cdot eV^{-1}$ to $1 \times 10^{13}$ $cm^{-2} \cdot eV^{-1}$, while that of the GaN surface compensated with nitrogen as in this embodiment is $1 \times 10^{11}$ $cm^{-2} \cdot eV^{-1}$ to $1 \times 10^{12}$ $cm^{-2} \cdot eV^{-1}$.

Drain electrodes 7 are formed in contact with the surfaces of the drawn portions 6 of the nitride semiconductor laminated structure 2. The drain electrodes 7 are electrically connected to the n-type GaN layer 3. On the other hand, a source electrode 13 is formed in contact with the top surface of the n-type GaN layer 5 of the nitride semiconductor laminated structure 2. The source electrode 13 is electrically connected to the n-type GaN layer 5.

A laminated structure of Ti/Al (lower layer/upper layer), for example, can be applied to the drain electrodes 7 and the source electrode 13. Alternatively, the drain electrodes 7 and the source electrode 13 may be made of Mo or an Mo compound (molybdenum silicide, for example), Ti or a Ti compound (titanium silicide, for example) or W or a W compound (tungsten silicide, for example). When made of such a material, the drain electrodes 7 and the source electrode 13 can be excellently brought into contact with wires (not shown) for applying a bias voltage to these electrodes 7 and 13.

Further, a gate insulating film 9 is formed on the surface of the nitride semiconductor laminated structure 2. The gate insulating film 9 includes the silicon nitride film 20 formed in contact with the overall surface of the nitride semiconductor laminated structure 2 and a silicon oxide film 10 formed on the silicon nitride film 20. The silicon nitride film 20 preferably has a sufficiently small thickness of 0.5 nm to 3 nm, for example. The thickness of the silicon oxide film 10 is 50 nm to 200 nm, for example. This thickness of the silicon oxide film 10 is properly varied with desired gate withstand voltage. An insulating film (not shown in FIG. 1) of SiON (silicon oxynitride) having a smaller thickness than the silicon nitride film 20 may be interposed between the silicon nitride film 20 and the silicon oxide film 10.

The gate electrode 11 is formed on the gate insulating film 9, to be opposed to the regions 12 through the gate insulating film 9. The gate electrode 11 can be made of a conductive material such as Pt (platinum), Al (aluminum), Ni/Au (alloy of nickel/gold), Ni/Ti/Au (alloy of nickel/titanium/gold), Pd/Au (alloy of palladium/gold), Pd/Ti/Au (alloy of palladium/titanium/gold), Pd/Pt/Au (alloy of palladium/platinum/gold), polysilicon, or the like.

The operation of the field-effect transistor show in FIG. 1 is now described.

A bias voltage positive on the side of the drain electrodes 7 is supplied between the source electrode 13 and the drain electrodes 7. Thus, a reverse voltage is supplied to the p-n junction on the interface between the n-type GaN layer 3 and the p-type GaN layer 4, whereby the n-type GaN layers 5 and 3, i.e., the source and the drain are cut off (reverse-biased). When a bias voltage of not less than a prescribed value (gate threshold voltage) positive with reference to the source electrode 13 is applied to the gate electrode 11 in this state, electrons are induced in the vicinity of the surfaces of the regions 12, to form inversion layers (channels). The n-type GaN layers 3 and 5 conduct through the inversion layers. Thus, the source and the drain conduct, thereby implementing the operation of the field-effect transistor. The regions 12 are made of the p⁻-type semiconductor having the lower acceptor concentration than the p-type GaN layer 4, whereby electrons can be induced on the regions 12 with a lower gate threshold voltage. When the p-type impurity concentration in the regions 12 is properly set, the source and the drain conduct when the gate electrode 11 is properly biased, while the source and the drain are cut off when the gate electrode 11 is not biased. In other words, normally-off operation is realized.

FIGS. 2A to 2F are illustrative sectional views successively showing the steps of producing the field-effect transistor shown in FIG. 1.

In order to produce the field-effect transistor, the n-type GaN layer 3, the p-type GaN layer 4 and the n-type GaN layer 5 are successively grown on the substrate 1 by MOCVD with principal growth surfaces of c-planes (0001), for example, as shown in FIG. 2A. Si, for example, may be employed as the n-type impurity for growing the n-type GaN layers 3 and 5. On the other hand, Mg or C, for example, may be employed as the p-type impurity for growing the p-type GaN layer 4.

Then, trenches 14 are formed, as shown in FIG. 2B. These trenches 14 are formed by etching the n-type GaN layer 3, the p-type GaN layer 4 and the n-type GaN layer 5 in a striped manner so as to cut out the wall surfaces 8 having a surface orientation inclined with respect to the c-planes (0001) in the range of 15° to 90°. This etching is carried out up to an intermediate portion of the n-type GaN layer 3 through the n-type GaN layer 5 and the p-type GaN layer 4 (nitride semiconductor laminated structure forming step and wall surface forming step).

More specifically, a photoresist film (not shown) having openings in regions for forming the trenches 14 is formed by well-known photolithography, and dry etching is thereafter performed through the photoresist film serving as a mask, for example. This dry etching is carried out with chlorine-based gas ($Cl_2$, $BCl_3$, $CCl_4$ or $SiCl_4$, for example). Thus, a plurality of (only two in FIG. 2) nitride semiconductor structures 2 are formed on the substrate 1 in a striped manner, while the drawn portions 6 consisting of extensions of the n-type GaN layer 3 and the wall surfaces 8 consisting of the n-type GaN layer 3, the p-type GaN layer 4 and the n-type GaN layer 5 are formed at the same time.

After the dry etching, wet etching may be performed in order to improve the wall surfaces 8 and the bottom surfaces of the trenches 14 damaged by the dry etching. HF (hydrofluoric acid) or HCl (hydrochloric acid) is preferably employed for the wet etching. Thus, an Si-based oxide, an oxide of Ga and the like removed and the wall surfaces 8 and the bottom surfaces of the trenches 14 can be smoothed, whereby less damaged surfaces can be obtained. Low-damaging dry etching can be applied in place of the wet etching.

Figure 2C:
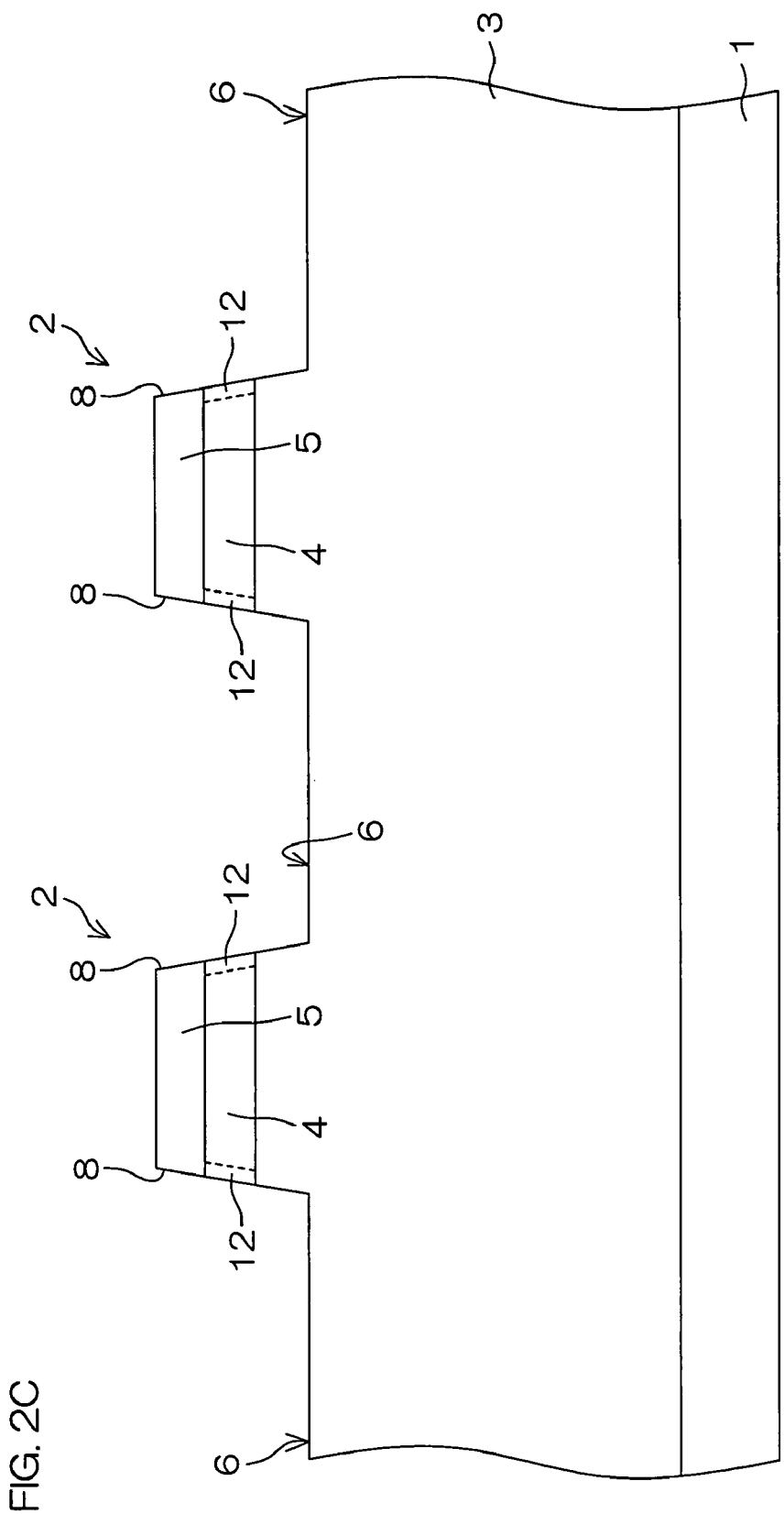

Then, the substrate 1 formed with the nitride semiconductor laminated structures 2 is introduced into an ECR (Electron Cyclotron Resonance) sputtering apparatus. Then, $Ar^+$ plasma having energy of about 30 eV, for example, is generated in the ECR sputtering apparatus with introduction of nitrogen gas ($N_2$ gas), to form a nitrogen atmosphere in the apparatus (step of placing the nitride semiconductor structure under a nitrogen atmosphere). The nitrogen atmosphere is defined as an environment irradiated with nitrogen molecules, nitrogen atoms, nitrogen radicals and a compound of nitrogen in high-temperature nitrogen gas or nitrogen plasma, for example. Then, the surface of each nitrogen semiconductor laminated structure 2 is irradiated with the $Ar^+$ plasma for several seconds. Due to this irradiation with the $Ar^+$ plasma, regions of the p-type GaN layer 4 at the wall surfaces 8 are denatured to form the regions 12 of the $p^-$-type semiconductor having the lower acceptor concentration than the p-type GaN layer 4, for example, different in conductivity from the p-type GaN layer 4 (fourth layer forming step), as shown in FIG. 2C.

Thereafter a negative voltage is applied to a target (Si in this embodiment) and the $Ar^+$ plasma is acceleratedly collided with the same. Thus, particles of the target (Si) are scattered and react with the nitrogen gas ($N_2$ gas) in the apparatus to form SiN (silicon nitride), which in turn is deposited on the surface of the nitride semiconductor laminated structure 2. Thus, a silicon nitride film is formed on the overall surface of the nitride semiconductor laminated structure 2. SiN is deposited by 0.5 nm to 3 nm, for example, due to the accelerated collision with the $Ar^+$ plasma.

Then, the gas introduced into the ECR sputtering apparatus is switched from the nitrogen gas ($N_2$ gas) to oxygen gas ($O_2$ gas) while continuing the accelerated collision of the $Ar^+$ plasma with the target. Thus, the target (Si) particles scattered by the $Ar^+$ plasma react with the oxygen gas ($O_2$ gas) in the apparatus to form $SiO_2$ (silicon oxide), which in turn is deposited on the surface of the silicon nitride film covering the overall surface of the nitride semiconductor laminated structure 2. Consequently, a silicon oxide film is formed on the overall surface of the silicon nitride film. Immediately after the switching from the nitrogen gas ($N_2$ gas) to the oxygen gas ($O_2$ gas), the nitrogen gas ($N_2$ gas) may remain in the apparatus, and hence an extremely thin SiON (silicon oxynitride) film may be formed around the interface between the aforementioned silicon oxide film and the aforementioned silicon nitride film.

After the formation of these insulating films, unnecessary portions (other than the gate insulating film 9) of the insulating films are removed by etching, thereby forming the gate insulating film 9 including the silicon nitride film 20 and the silicon oxide film 10 (gate insulating film forming step), as shown in FIG. 2D.

Figure 2E:
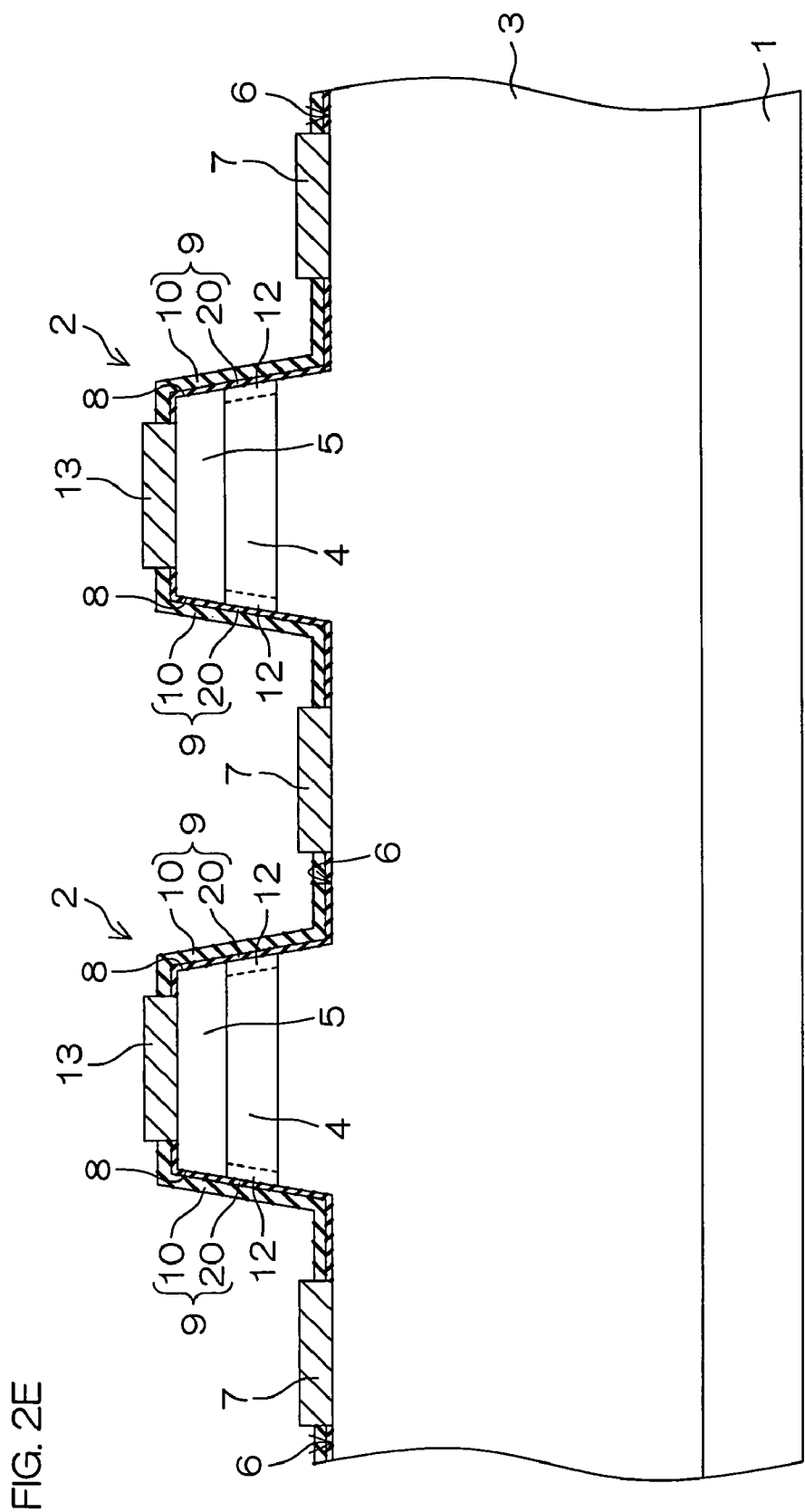

Then, a photoresist film (not shown) having openings in regions for forming the drain electrodes 7 and the source electrode 13 is formed by well-known photolithography. Then, metals (Ti and Al, for example) employed as the materials for the drain electrodes 7 and the source electrode 13 are deposited by sputtering from above the photoresist film in the order of Ti/Al. Thereafter the photoresist film is removed, thereby lifting off unnecessary portions (other than the drain electrodes 7 and the source electrode 13) of the metals along with the photoresist film. Through these steps, the drain electrodes 7 are formed in contact with the surfaces of the drawn portions 6 while the source electrode 13 is formed in contact with the top surface of the n-type GaN layer 5, as shown in FIG. 2E. After the formation of the drain electrodes 7 and the source electrode 13, thermal alloying (annealing) is performed so that the drain electrodes 7 and the n-type GaN layer 3 as well as the source electrode 13 and the n-type GaN layer 5 are in ohmic contact with one another.

Then, a photoresist film (not shown) having an opening in a region for forming the gate electrode 11 is formed by well-known photolithography. Then, a metal (the aforementioned conductive material, for example) employed as the material for the gate electrode 11 is deposited by sputtering from above the photoresist film. Thereafter the photoresist film is removed, thereby lifting off unnecessary portions (other than the gate electrode 11) of the metal along with the photoresist film. Through these steps, the gate electrode 11 opposed to the wall surfaces 8 and the edges of the wall surfaces 8 on the n-type GaN layers 3 and 5 are formed (gate electrode forming step), as shown in FIG. 2F. Thus, the field-effect transistor having the structure shown in FIG. 1 can be obtained.

The plurality of nitride semiconductor laminated structures 2 formed on the substrate 1 form unit cells respectively. The gate electrodes 11, the drain electrodes 7 and the source electrodes 13 of the plurality of nitride semiconductor laminated structures 2 are common-connected with one another on unshown positions respectively. The adjacent nitride semiconductor laminated structures 2 can share the drain electrode 7 provided therebetween.

According to this embodiment, as hereinabove described, the $Ar^+$ plasma is first generated in the ECR sputtering apparatus while the nitrogen atmosphere is formed in the apparatus to place the nitride semiconductor laminated structure 2 under the nitrogen atmosphere, in order to form the gate insulating film 9 in the ECR sputtering apparatus. Even if nitrogen vacancies are formed in the GaN crystal lattice of the nitride semiconductor laminated structure 2, therefore, these nitrogen vacancies can be compensated with nitrogen atoms (N atoms) of the nitrogen gas ($N_2$ gas) by nitriding the portion around the surface of the nitride semiconductor laminated structure 2. Further, the target (Si) particles are scattered by the $Ar^+$ plasma in the nitrogen atmosphere of the apparatus. Therefore, SiN resulting from the reaction between the target (Si) particles and the nitrogen gas ($N_2$ gas) in the apparatus can be deposited on the surface of the nitride semiconductor laminated structure 2. Consequently, the nitrogen vacancy concentration between the source electrode 13 and the drain electrodes 7 (between the source and the drain) can be reduced on the surface of the nitride semiconductor laminated structure 2, and the silicon nitride film 20 can be formed in contact with these portions. Therefore, the surface level density can be reduced by suppressing generation of surface charges on the regions between the source electrode 13 and the drain electrodes 7, whereby surface leakage current can be reduced. Needless to say, the field-effect transistor made of GaN (group III nitride semiconductor) can realize superior characteristics such as high withstand voltage, high-temperature operation, large current density, high-speed switching and low on-resistance as compared with a device made of a silicon semiconductor.

According to this embodiment, the regions 12 are formed on the semiconductor surface portions of the p-type GaN layer 4 at the wall surfaces 8, and the gate electrode 11 is opposed to these regions 12 through the gate insulating film 9. In the operation of the field-effect transistor, therefore, the inversion layers (channels) are formed in the vicinity of the interfaces between the regions 12 and the gate insulating film 9. Further, the regions 12 are made of a p⁻-type semiconductor, an n-type semiconductor, an i-type semiconductor or a semiconductor containing n- and p-type impurities, for example. Therefore, the value of the gate voltage necessary for forming the inversion layers (channels) can be reduced. Consequently, the gate threshold voltage can be reduced while keeping the acceptor concentration of the p-type GaN layer 4 at a high level to cause no reach-through breakdown. Therefore, excellent transistor operation can be performed, and an excellent power device can be realized.

According to this embodiment, further, the silicon nitride film 20 has the sufficiently small thickness of 0.5 nm to 3 nm, for example. When the silicon nitride film 20 and the silicon oxide film 10 are laminated, the interface between the silicon nitride film 20 and the silicon oxide film 10 (insulating film interface) may be charged from the nitride semiconductor laminated structure 2. When the thickness of the silicon nitride film 20 is about 0.5 nm to 3 nm as in this embodiment, however, charges collected on the insulating film interface can easily pass through the silicon nitride film 20. Consequently, the insulating film interface can be prevented from being kept in a charged state.

Figure 3:
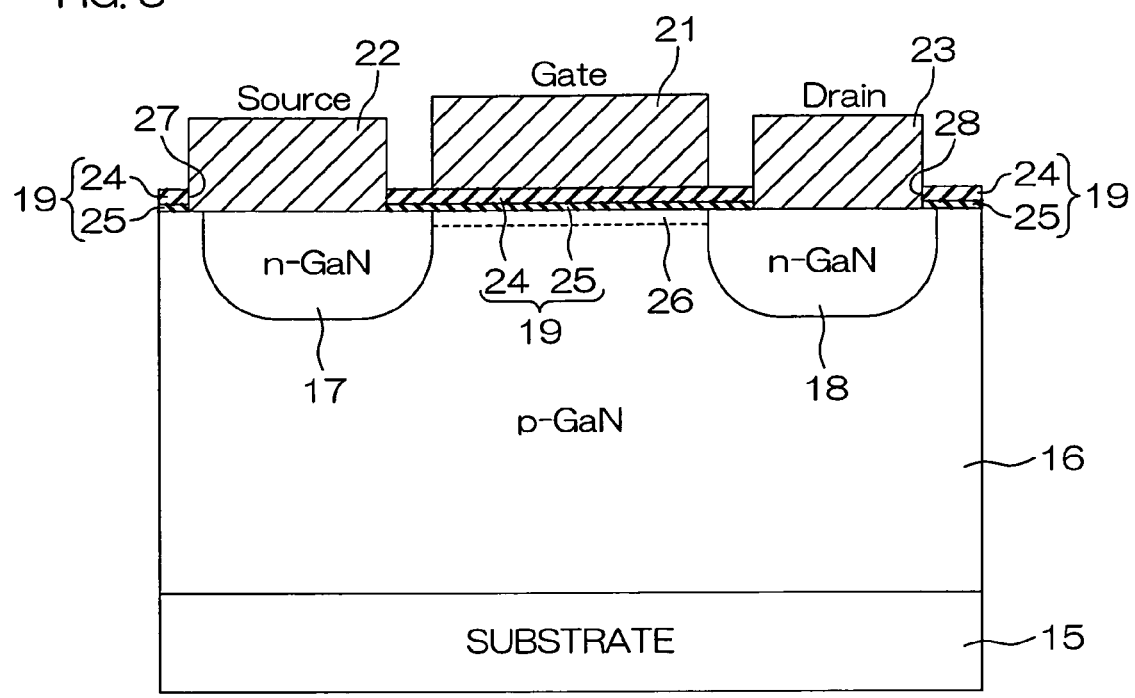
FIG. 3 is a schematic sectional view for illustrating the structure of a field-effect transistor according to a second embodiment of the present invention.

FIG. 3 is a schematic sectional view for illustrating the structure of a field-effect transistor according to a second embodiment of the present invention.

This field-effect transistor (nitride semiconductor device) includes a substrate 15 and a p-type GaN layer 16, containing a p-type impurity, of a GaN compound semiconductor (group III nitride semiconductor) grown on the substrate 15.

For example, an insulating substrate such as a sapphire substrate or a conductive substrate such as a GaN substrate, a ZnO substrate, an Si substrate, a GaAs substrate or an SiC substrate can be applied to the substrate 15.

On the p-type GaN layer 16, a plurality of n-type regions 17 (second n-type region) and 18 (first n-type region) in the form of stripes in plan view are formed on the surface layer opposite to the substrate 15. The n-type regions 17 and 18 are alternately formed at prescribed intervals in a direction (referred to as "width direction" in this embodiment) orthogonal to the direction of the aforementioned stripes.

The surface of the p-type GaN layer 16 is compensated with nitrogen. In other words, nitrogen vacancies are hardly present in the vicinity of the surface of the p-type GaN layer 16, similarly to the nitride semiconductor laminated structure 2 according to the first embodiment. A GaN surface compensated with nitrogen has a higher nitrogen concentration than a GaN surface not compensated with nitrogen, and is hardly surface-charged. For example, the surface charge concentration of the GaN surface not compensated with nitrogen is $1 \times 10^{12}$ cm$^{-2}$·eV$^{-1}$ to $1 \times 10^{13}$ cm$^{-2}$·eV$^{-1}$, while that of the GaN surface compensated with nitrogen as in this embodiment is $1 \times 10^{11}$ cm$^{-2}$·eV$^{-1}$ to $1 \times 10^{12}$ cm$^{-2}$·eV$^{-1}$.

A plurality of (three in FIG. 3) gate insulating films 19 in the form of stripes in plan view are formed on the surface of the p-type GaN layer 16 along the direction of the stripes of the n-type regions 17 and 18. Each gate insulating film 19 is formed over edges of the corresponding n-type regions 17 and 18 in the width direction. Contact holes 27 and 28 exposing the n-type regions 17 and 18 are formed between the adjacent gate insulating films 19.

Each gate insulating film 19 includes a silicon nitride film 25 formed in contact with the surface of the p-type GaN layer 16 and a silicon oxide film 24 formed on the silicon nitride film 25. The silicon nitride film 25 preferably has a sufficiently small thickness of 0.5 nm to 3 nm, for example. The thickness of the silicon oxide film 24 is 50 nm to 200 nm, for example. This thickness of the silicon oxide film 24 is properly varied with desired gate withstand voltage. An insulating film (not shown in FIG. 3) of SiON (silicon oxynitride) having a smaller thickness than the silicon nitride film 25 may be interposed between the silicon nitride film 25 and the silicon oxide film 24.

A gate electrode 21 opposed to the p-type GaN layer 16 is formed on the gate insulating film 19 in the region located between the n-type regions 17 and 18 through the gate insulating film 19. The gate electrode 21 can be made of a conductive material such as Pt (platinum), Al (aluminum), Ni/Au (alloy of nickel/gold), Ni/Ti/Au (alloy of nickel/titanium/gold), Pd/Au (alloy of palladium/gold), Pd/Ti/Au (alloy of palladium/titanium/gold), Pd/Pt/Au (alloy of palladium/platinum/gold) or polysilicon, or the like.

A channel region 26 is opposed to the gate electrode 21 on the surface of the p-type GaN layer 16. When a proper bias voltage is supplied to the gate electrode 21, an inversion layer (channel) allowing the n-type regions 17 and 18 to electrically conduct is formed on the channel region 26.

A source electrode 22 is formed in contact with the n-type region 17 exposed from the contact hole 27. The source electrode 22 is electrically connected to the n-type region 17. On the other hand, a drain electrode 23 is formed in contact with the n-type region 18 exposed from the contact hole 28. The drain electrode 23 is electrically connected to the n-type region 18.

A laminated structure of Ti/Al (lower layer/upper layer), for example, can be applied to the source electrode 22 and the drain electrode 23. Alternatively, the source electrode 22 and the drain electrode 23 may be made of Mo or an Mo compound (molybdenum silicide, for example), Ti or a Ti compound (titanium silicide, for example) or W or a W compound (tungsten silicide, for example). When made of such a material, the source electrode 22 and the drain electrode 23 can be excellently brought into contact with wires (not shown) for applying a bias voltage to these electrodes 22 and 23.

Operation of the field-effect transistor shown in FIG. 3 is now described.

A bias voltage positive on the side of the drain electrode 23 is supplied between the source electrode 22 and the drain electrode 23. Thus, a reverse voltage is supplied to the p-n junction on the interface between the n-type region 18 and the p-type region of the p-type GaN layer 16, whereby the n-type regions 17 and 18, i.e., the source and the drain are cut off (reverse-based). When a bias voltage of not less than a prescribed voltage (gate threshold voltage) positive with reference to the source electrode 22 is applied to the gate electrode 21 in this state, electrons are induced in the vicinity of the surface of the channel region 26 of the p-type GaN layer 16, to form the inversion layer (channel). The n-type regions 17 and 18 conduct through this inversion layer. Thus, the source and the drain conduct. In other words, the source and the drain conduct when the gate electrode 21 is biased, while the source and the drain are cut off when the gate electrode 21 is not biased. That is, normally-off operation is realized.

FIGS. 4A to 4E are illustrative sectional views successively showing the steps of producing the field-effect transistor shown in FIG. 3.

Figure 4A:
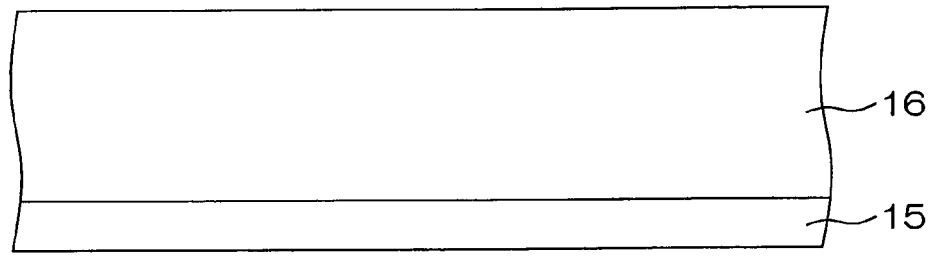
FIGS. 4A to 4E are illustrative sectional views successively showing the steps of producing the field-effect transistor shown in FIG. 3.

In order to produce this field-effect transistor, the p-type GaN layer 16 is grown on the substrate 15 by MOCVD with a principal growth surface of a c-plane (0001), for example, as shown in FIG. 4A. Mg or C, for example, may be employed as the p-type impurity for growing the p-type GaN layer 16.

Figure 4B:
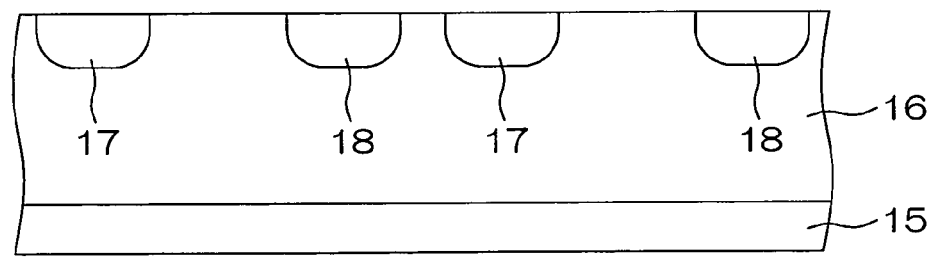

Then, a photoresist film (not shown) having openings in regions for forming the n-type regions 17 and 18 is formed on the surface of the p-type GaN layer 16 by well-known photolithography. After the formation of the photoresist film, an n-type impurity is ion-implanted into the surface of the p-type GaN layer 16 through the photoresist film serving as a mask by well-known ion implantation. Thus, the n-type regions 17 and 18 are formed on the surface layer of the p-type GaN layer 16 in the form of stripes, as shown in FIG. 4B. Si, for example, may be employed as the n-type impurity for forming the n-type regions 17 and 18.

Then, the substrate 15 formed with the p-type GaN layer 16 is introduced into an ECR (Electron Cyclotron Resonance) sputtering apparatus. Then, $Ar^+$ plasma having energy of 30 eV, for example, is generated in the ECR sputtering apparatus with introduction of nitrogen gas ($N_2$ gas), to form a nitrogen atmosphere in the apparatus (step of placing the group III nitride semiconductor under a nitrogen atmosphere). The portion around the surface of the p-type GaN layer 16 is nitrided due to the nitrogen atmosphere in the apparatus.

Thereafter a negative voltage is applied to a target (Si in this embodiment) and the $Ar^+$ plasma is acceleratedly collided with the same. Thus, particles of the target (Si) are scattered and react with the nitrogen gas ($N_2$ gas) in the apparatus to form SiN (silicon nitride), which in turn is deposited on the surface of the p-type GaN layer 16. Thus, a silicon nitride film is formed on the overall surface of the p-type GaN layer 16. SiN is deposited by 0.5 nm to 3 nm, for example, due to the accelerated collision with the $Ar^+$ plasma.

Then, the gas introduced into the ECR sputtering apparatus is switched from the nitrogen gas ($N_2$ gas) to oxygen gas ($O_2$ gas) while continuing the accelerated collision of the $Ar^+$ plasma with the target. Thus, the target (Si) particles scattered by the $Ar^+$ plasma react with the oxygen gas ($O_2$ gas) in the apparatus to form $SiO_2$ (silicon oxide), which in turn is deposited on the surface of the silicon nitride film covering the overall surface of the p-type GaN layer 16. Consequently, a silicon oxide film is formed on the overall surface of the silicon nitride film. Immediately after the switching from the nitrogen gas ($N_2$ gas) to the oxygen gas ($O_2$ gas), the nitrogen gas ($N_2$ gas) may remain in the apparatus, and hence an extremely thin SiON (silicon oxynitride) film may be formed around the interface between the aforementioned silicon oxide film and the aforementioned silicon nitride film.

Figure 4C:
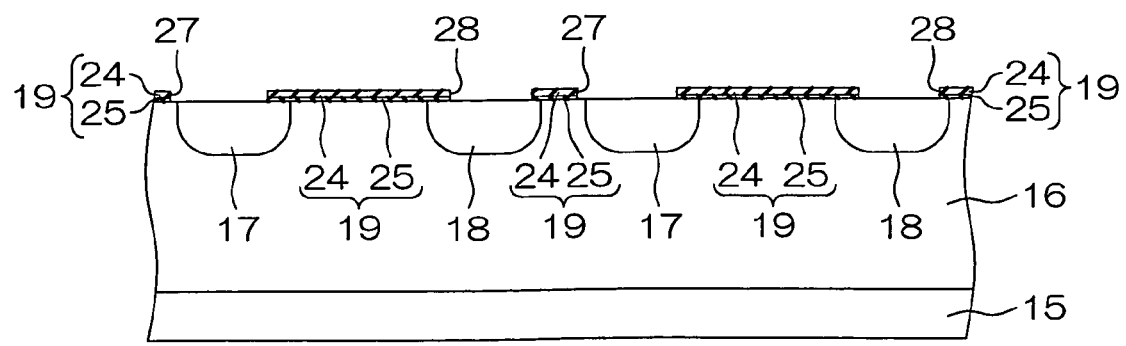

After the formation of these insulating films, unnecessary portions (other than the gate insulating film 19) of the insulating films are removed by etching and the contact holes 27 and 28 are formed, thereby forming the gate insulating film 19 including the silicon nitride film 25 and the silicon oxide film 24 (gate insulating film forming step), as shown in FIG. 4C.

Then, a photoresist film (not shown) having openings in regions for forming the drain electrode 23 and the source electrode 22 is formed by well-known photolithography.

Figure 4D:
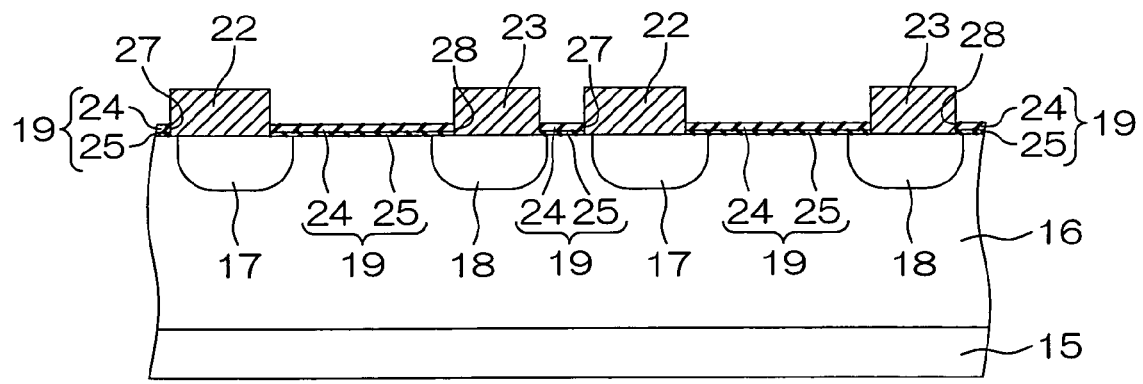
Figure 4E:
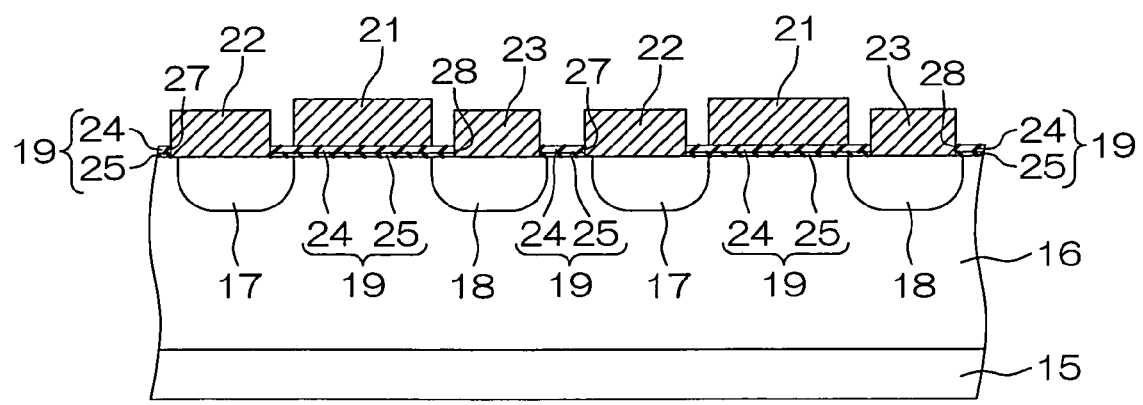
Figure 5:
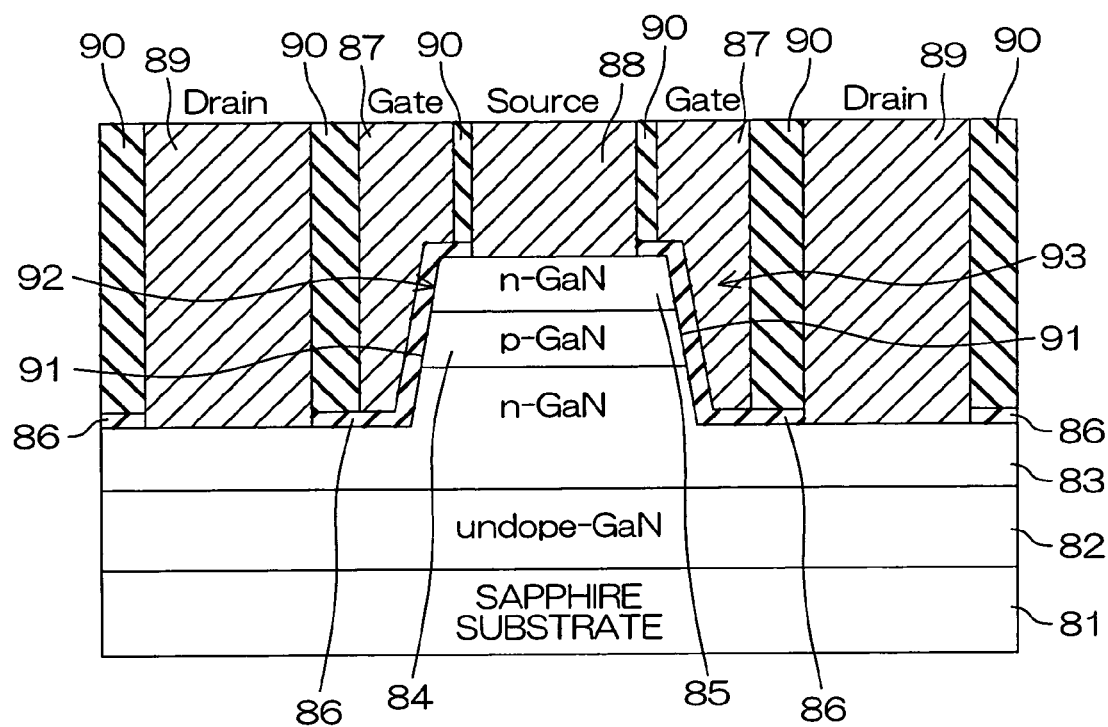
FIG. 5 is a schematic sectional view for illustrating the structure of a conventional field-effect transistor.

Then, metals (Ti and Al, for example) employed as the materials for the drain electrode 23 and the source electrode 22 are deposited by sputtering from above the photoresist film in the order of Ti/Al. Thereafter the photoresist film is removed, thereby lifting off unnecessary portions (other than the drain electrode 23 and the source electrode 22) of the metals along with the photoresist film. Through these steps, the source electrode 22 is formed in contact with the n-type region 17 and the drain electrode 23 is formed in contact with the n-type region 18, as shown in FIG. 4D. After the formation of the source electrode 22 and the drain electrode 23, thermal alloying (annealing) is performed so that the source electrode 22 and the n-type region 17 as well as the drain electrode 23 and the n-type region 18 are in ohmic contact with one another.

Then, a photoresist film (not shown) having an opening in a region for forming the gate electrode 21 is formed by well-known photolithography. Then, a metal (the aforementioned conductive material, for example) employed as the material for the gate electrode 21 is deposited by sputtering from above the photoresist film. Thereafter the photoresist film is removed, thereby lifting off unnecessary portions (other than the gate electrode 21) of the metal along with the photoresist film. Through these steps, the gate electrode 21 opposed to the p-type GaN layer 16 is formed in the region located between the n-type regions 17 and 18 through the gate insulating film 19 (gate electrode forming step). Thus, the field-effect transistor having the structure shown in FIG. 3 can be obtained.

Each pair of n-type regions 17 and 18 formed on the p-type GaN layer 16 and the portion located between these regions 17 and 18 in the width direction of the p-type GaN layer 16 form a unit cell. The gate electrodes 21, the drain electrodes 23 and the source electrodes 22 of a plurality of such unit cells are common-connected with one another in unshown positions respectively.

Also according to the second embodiment, when the gate insulating film 19 is formed in the ECR sputtering apparatus, nitrogen vacancies on the surface of the p-type GaN layer 16 can be compensated with nitrogen atoms (N atoms) and SiN can be deposited on the p-type GaN layer 16, similarly to the first embodiment. Consequently, the nitrogen vacancy concentration can be reduced in the portion located between the source electrode 22 and the drain electrode 23 (between the source and the drain) on the surface of the p-type GaN layer 16, and the silicon nitride film 25 can be formed in contact with this portion. Therefore, the surface level density can be reduced by suppressing generation of surface charges on the region between the source electrode 22 and the drain electrode 23, whereby surface leakage current can be reduced. Needless to say, the field-effect transistor made of GaN (group III nitride semiconductor) can realize superior characteristics such as high withstand voltage, high-temperature operation, large current density, high-speed switching and low on-resistance as compared with a device made of a silicon semiconductor.

Further, the thickness of the silicon nitride film 25 is about 0.5 nm to 3 nm, whereby the interface between the silicon nitride film 25 and the silicon oxide film 24 can be prevented from being kept in a charged state.

While the embodiments of the present invention have been described, the present invention can be executed also in other embodiments.

In the first embodiment, for example, the nitride semiconductor laminated structure 2 may include at least an n-type group III nitride semiconductor layer, a group III nitride semiconductor layer containing a p-type impurity and an n-type group III nitride semiconductor layer. In the nitride semiconductor laminated structure 2, an n-type AlGaN layer or the like may be formed in contact between the substrate 1 and the n-type GaN layer 3, in addition to the n-type GaN layer 3, the p-type GaN layer 4 and the n-type GaN layer 5, for example.

While the source electrodes 13 and 22 are formed in contact with the n-type GaN layer 5 and the n-type region 17 respectively in the aforementioned embodiments, the source electrodes 13 and 22 may not be in contact with the n-type GaN layer 5 and the n-type region 17 respectively when the source electrode 13 and the n-type GaN layer 5 as well as the source electrode 22 and the n-type region 17 can be electrically connected with one another. Further, the drain electrodes 7 and 23 may not be in contact with the n-type GaN layer 3 and the n-type region 18 respectively, when the drain electrodes 7 and the n-type GaN layer 3 as well as the drain electrode 23 and the n-type region 18 can be electrically connected with one another.

While MOCVD is applied as the method for growing the nitride semiconductor laminated structure 2 and the p-type GaN layer 16 in the aforementioned embodiments, another method such as LPE (Liquid Phase Epitaxy), VPE (Vapor Phase Epitaxy) or MBE (Molecular Beam Epitaxy) may alternatively be applied.

While the gate insulating films 9 and 19 have the laminated structures of the silicon nitride films 20 and 25 and the silicon oxide films 10 and 24 respectively in the aforementioned embodiments, the gate insulating films 9 and 19 may alternatively be constituted of only the silicon oxide films 10 and 24 without the silicon nitride films 20 and 25.

In the second embodiment (FIG. 3), an n⁻-type region having a low impurity concentration may be formed in the vicinity of the interface between the n-type region 18 and the channel region 26. In this case, the withstand voltage characteristics of the field-effect transistor can be improved.

While the silicon oxide films 10 and 24 are applied as the insulating films containing oxygen in the gate insulating films 9 and 19 respectively in the aforementioned embodiments, insulating films containing $HfO_2$ (hafnium oxide), $Ga_2O_3$ (gallium oxide), $Al_2O_3$ (aluminum oxide) or SiON (silicon oxynitride), for example, maybe applied in place of the silicon oxide films 10 and 24.

Although the embodiments of the present invention are described in detail, these embodiments are merely specific examples used for clarifying the technical contents of the present invention. Therefore, the present invention should not be construed as being limited in any way of these specific examples. The spirit and scope of the present invention are limited only by the scope of the appended claims.

This application corresponds to Japanese Patent Application No. 2007-193410 filed with the Japanese Patent Office on Jul. 25, 2007, the full disclosure of which is incorporated herein by reference.

What is claimed is:

1. A nitride semiconductor device, comprising:
a nitride semiconductor structure that is made of a Group III nitride semiconductor, that includes:
a first layer that is an n-type first layer;
a second layer containing a p-type impurity laminated on the first layer; and
a third layer that is an n-type third layer laminated on the second layer so that the nitride semiconductor struture is a laminated structure having lamination interfaces, and that has a wall surface extending over the first, second and third layers;
a gate insulating film containing oxygen formed on a region of the wall surface extending over the first, second and third layers;
a gate electrode opposed to the second layer through the gate insulating film;
a source electrode electrically connected to the third layer; and
a drain electrode electrically connected to the first layer,
wherein a region provided with the gate insulating film has a nitrogen concentration that is higher than that in a region not provided with the gate insulating film on the surface of the nitride semiconductor structure,
wherein the lamination interfaces of the nitride semiconductor structure are c-planes, and
wherein the wall surface is an m-plane or an a-plane.

2. The nitride semiconductor device according to claim 1, wherein the gate insulating film includes a silicon nitride film formed on the surface of the Group III nitride semiconductor and an oxide film containing oxygen formed on the silicon nitride film.

3. The nitride semiconductor device according to claim 2, wherein the silicon nitride film has a thickness of not more than 3 nm.

4. A nitride semiconductor device, comprising:
a nitride semiconductor layer made of a Group III nitride semiconductor containing a p-type impurity;
a first n-type region and a second n-type region positioned on the surface layer of the nitride semiconductor layer at a prescribed interval;
a gate insulating film containing oxygen formed on a region of the surface of the nitride semiconductor layer extending over the first n-type region and the second n-type region;
a gate electrode opposed to the nitride semiconductor layer provided on a region between the first n-type region and the second n-type region through the gate insulating film;
a drain electrode electrically connected to the first n-type region; and
a source electrode electrically connected to the second n-type region,
wherein a region provided with the gate insulating film has a nitrogen concentration that is higher than that in a region not provided with the gate insulating film on the surface of the nitride semiconductor layer,
wherein the gate insulating film includes a silicon nitride film formed on the surface of the Group III nitride semiconductor and having a thickness of not more than 3 nm and an oxide film containing oxygen formed on the silicon nitride film.

\* \* \* \* \*